United States Patent [19]

Murray et al.

[11] 4,435,658
[45] Mar. 6, 1984

[54] TWO-LEVEL THRESHOLD CIRCUITRY FOR LARGE SCALE INTEGRATED CIRCUIT MEMORIES

[75] Inventors: Lance R. Murray; Ta-Ming Wu, both of San Diego, Calif.

[73] Assignee: Burroughs Corporation, Detroit, Mich.

[21] Appl. No.: 235,040

[22] Filed: Feb. 17, 1981

[51] Int. Cl.³ .................... G01R 19/165; H03K 5/24; H03K 19/017
[52] U.S. Cl. .................... 307/530; 307/360; 307/450; 307/473
[58] Field of Search ............... 307/354, 360, 363, 362, 307/530, 473, DIG. 3; 365/206, 207, 208, 189, 191, 195, 196

[56] References Cited

U.S. PATENT DOCUMENTS

| | | | |
|---|---|---|---|
| 3,519,849 | 7/1970 | Tyler | 307/360 |
| 3,609,411 | 9/1971 | Ma et al. | 307/475 |
| 3,775,693 | 11/1973 | Proebsting | 307/450 |
| 3,851,189 | 11/1974 | Moyer | 307/360 X |
| 3,950,656 | 4/1976 | Sumida et al. | 307/473 X |
| 3,952,213 | 4/1976 | Fukaya | 307/360 X |
| 3,956,708 | 5/1976 | Musa | 307/355 X |
| 3,969,633 | 7/1976 | Paluck et al. | 307/473 |
| 4,069,432 | 1/1978 | Bazin | 307/364 X |
| 4,100,429 | 7/1978 | Adachi | 307/473 |
| 4,179,691 | 12/1979 | Keller | 307/360 X |

FOREIGN PATENT DOCUMENTS 55-3210  1/1980  Japan .................... 307/360

Primary Examiner—Larry N. Anagnos
Attorney, Agent, or Firm—Mervyn L. Young; J. Ronald Richbourg; Charles J. Fassbender

[57] ABSTRACT

This disclosure relates to circuitry which includes a low threshold detector and a high threshold detector in the form of inverters the respective output signals of which are combined in such a manner that the output signal of the circuitry is a function of the input signal rising above a low threshold and remaining in an on condition until the input signal has risen above a high threshold and then declined below it. In addition, the circuitry includes a circuit memory element in which is stored the last stable state of the circuitry so that if noise or transients should occur on the input line, the circuitry can return to that stable state. This circuit enables the rapid detection of a memory readout even though the signals on the memory sense lines have relatively slow rise and fall times due to the capacitances on those lines which in turn are due to the large number of memory cells involved. Furthermore, the disclosed invention can be employed in any system in which switching speed is of importance.

8 Claims, 4 Drawing Figures

TWO-LEVEL THRESHOLD CIRCUITRY FOR LARGE SCALE INTEGRATED CIRCUIT MEMORIES

BACKGROUND OF THE INVENTION

1. Field of the Invention

This invention relates to a two-level threshold circuitry and more particularly to such circuitry for large scale digital memories such as found in LSI and VLSI semiconductor devices.

2. Description of the Prior Art

As the packing density of large scale and very large scale integrated circuitry becomes greater and greater, the cost of the individual circuit units becomes more and more inexpensive. This is particularly true in regard to digital memories which are currently being built with hundreds of thousands of memory cells and eventually millions of memory cells, each one of which stores an individual bit of data. As the size of the respective memories increases, the capacitances of the bit lines or sense lines increases with the result that it is more difficult to rapidly change the voltage levels on those lines. This is particularly true of read-only memories (ROMs) and programmable read-only memories (PROMs) which are finding increasing usage as the cost per unit cell decreases.

ROMs were initially in the form of diode and core matrices and were employed as data memories. However, in 1951, Maurice V. Wilkes postulated a decoder for a digital computer which was formed of a fixed matrix (a ROM) wherein selected nodes of the matrix were provided with core crossconnections so that, for any given set of incoming signals, a desired set of output signals could be generated (see Wilkes, "The Best Way to Design an Automatic Calculating Machine", report of Manchester University Computer Inaugural Conference, July, 1951, page 16). With the advancement of integrated circuitry, such core matrices are now created in the form of IC ROMs which again can have tens of thousands of gates to accommodate an extremely large number of boolean operations to be performed in the sense that the incoming signals are merely an address to a particular location in the ROM at which are stored the desired combination of output signals required.

Wilkes' original design led to the concept of microprogramming as a means of decoding computer instructions, (see Faber et al U.S. Pat. No. 3,983,539 or Ferguson et al U.S. Pat. No. 3,886,523). However, the concept has been employed for addition, subtraction, and multiplication through the use of tables in the form of such matrices or memories, (see Gerace, "Microprogram Control for Computing Systems", *IEEE Transactions on Electronic Computers*, December, 1963, at page 742). This concept has now advanced to what is today referred to in many circles as stored logic or structural firmware as well as control firmware. This in turn gives the computer designer greater flexibility in the designing of various functions that he wishes the circuitry to perform and tends to create a greater demand for larger and larger memories or IC memories with higher packing densities.

As the packing density of integrated circuit devices becomes higher, there is corresponding increase in the switching speed of the various circuits. However, particularly in ROM type memories, the increase in the number of gates in the circuitry adds to the capacitances of the sense lines which tends to impede the switching speed.

It is, then, an object of the present invention to provide an improved threshold sensing device for large scale integrated circuit memories.

It is another object of the present invention to provide improved threshold devices for both ROMs and PROMs.

It is still a further object of the present invention to provide an improved threshold circuitry for large scale integrated circuits which can be switched between two different thresholds.

SUMMARY OF THE INVENTION

In order to accomplish the above objects, the present invention is directed toward circuitry including a low threshold detector and a high threshold detector with the circuitry being adapted to provide an output signal which is a function of the input signal rising above a low threshold and remaining in an on condition until the input signal has risen above the high threshold and then declined below it. The circuitry includes a circuit memory element in which is stored the last stable state of the circuitry so that if noise or transients should occur on the input line, the circuitry can return to that stable state.

A feature then of the present invention resides in circuitry including a low threshold detector and a high threshold detector and output means to supply an output signal which is a function of the input signal rising above a low threshold and remaining in an on condition until the input signal has risen above the high threshold and then declined below it.

BRIEF DESCRIPTION OF THE DRAWINGS

The above and other objects, advantages and features of the present invention will become more readily apparent from a review of the following specification when taken in conjunction with the drawings wherein:

FIGS. 3 and 4 are schematic diagrams illustrating different inverter circuits that might be employed in the present invention.

GENERAL DESCRIPTION OF THE INVENTION

As was indicated above, large scale digital memories and particularly ROMs and PROMs encounter high capacitances on their sense lines which tend to inhibit the rate of change or ramp of signals on those lines. Prior art sense amplifiers and threshold detectors have generally been adapted to detect a relatively high voltage level or threshold and then to generate an output signal once that threshold has been reached. However, if the sensed signal does not reach that threshold, no readout occurs. The present invention is adapted to sense both a low threshold level to generate an output signal and to maintain that signal until the sensed signal has passed a high threshold level, and then declined below it. Furthermore, the present invention is adapted to generate an output signal with a high rate of change or ramp. While dynamic RAMs are provided with sense lines that are normally precharged and do not require a type of threshold circuitry of the present invention, such circuitry may find application in this situation also when switching speed is of importance.

Figure 1:
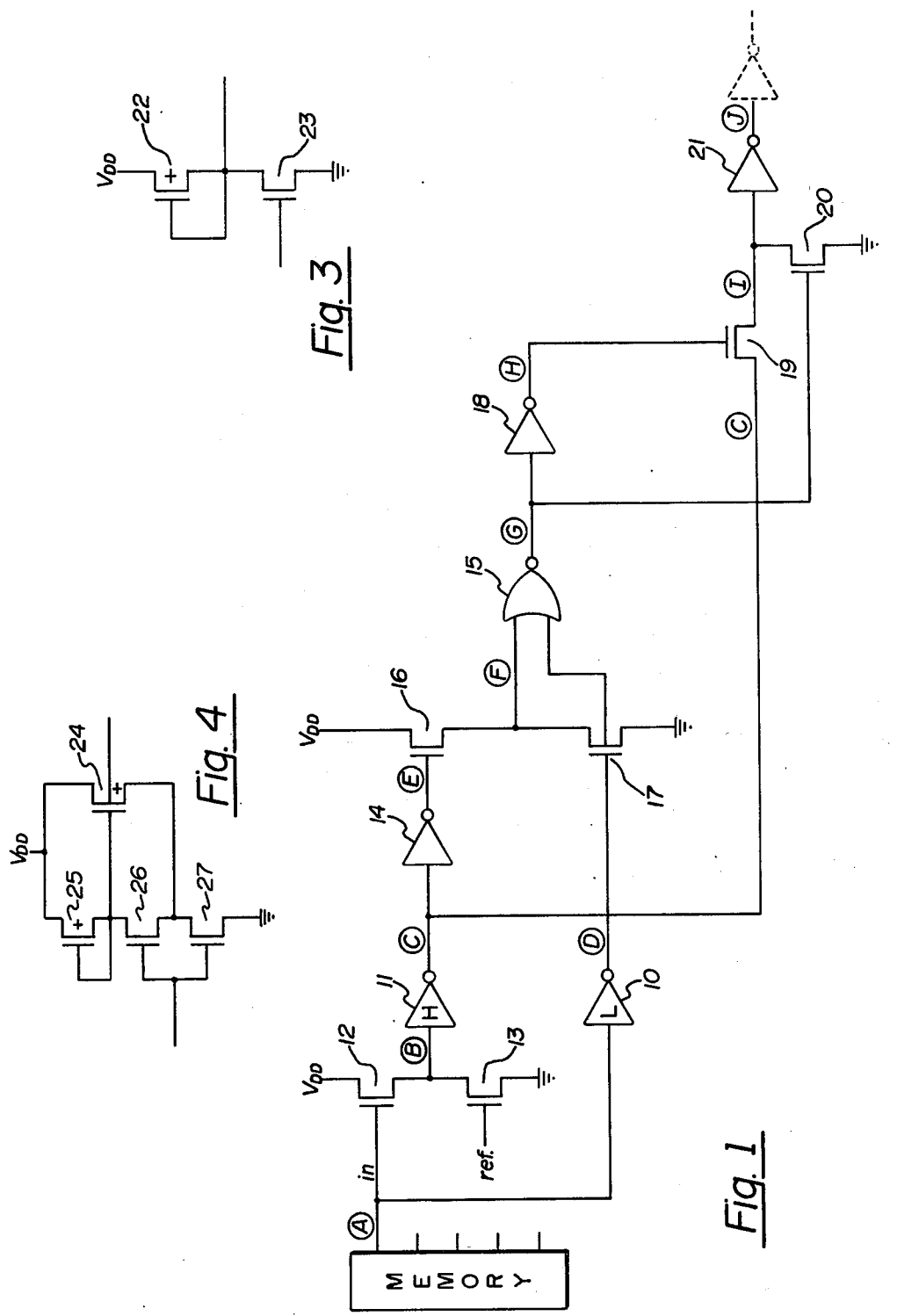
FIG. 1 is a schematic diagram of the present invention.

To this end, the present invention is directed toward circuitry including a low threshld detector and a high threshold detector in the form of inverters the respective output signals of which are combined in such a manner that the output signal of the circuit is a function of the input signal rising above a low threshold and remaining in an on condition until the input signal has risen above a high threshold and then declined below it. As illustrated in FIG. 1, the input signal is received by low threshold inverter 10 and high threshold inverter 11, the outputs of which are supplied to NOR gate 15. Because of the type of circuitry employed, the output signal from NOR gate 15 will produce an output signal when the input signal rises above a low threshold value and will be turned off when that input signal rises above a high threshold value. The output of high threshold inverter 11 is employed to then turn off the circuitry when the input signal declines below a high threshold value.

DETAILED DESCRIPTION OF THE INVENTION

In order to provide a better description of the present invention, the circuitry of FIG. 1 and the waveforms of FIG. 2 will be described together where the letters in a circle in FIG. 1 indicate the voltage at that point corresponding to the waveforms illustrated in FIG. 2. It will be understood from FIG. 1 that the preferred embodiment of the present invention employs metal oxide silicon (MOS) technology.

Figure 2:
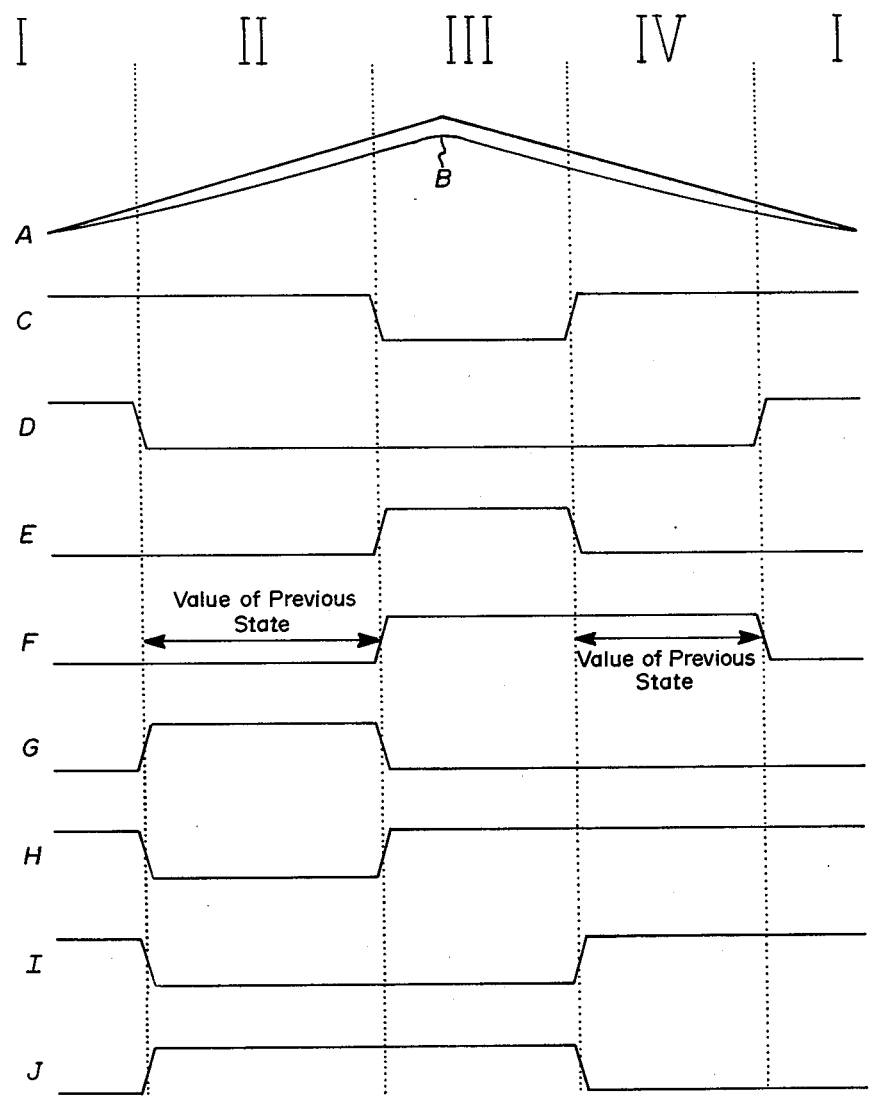
FIG. 2(A to J) is a set of waveforms illustrating the operation of the circuitry of FIG. 1.

The circuit of FIG. 1 operates in four states which are indicated in FIG. 2 as I..., IV. In the first state (I) the input signal at node A is sufficiently low so as to be below the threshold values of low threshold inverter 10 and high threshold inverter 11. It is to be noted from FIG. 1 that the input signal drives low threshold inverter 10 directly but is supplied to high threshold inverter 11 by way of a voltage divider to raise the effective threshold level of high threshold inverter 11. As was indicated above, in other circuit designs or where the high threshold value is to be of a moderate value, the voltage divider can be eliminated.

When the input signal (node A) is low, both inverters 10 and 11 will have high outputs, nodes C and D respectively as indicated by the corresponding waveforms C and D in FIG. 2. As a result, the output of inverter 14, node E, is low thereby turning off gate 16. The output of low threshold inverter 10, node D, is high which causes gate 17 to be conducting and thus results in node F, one of the inputs to NOR gate 15, to be low. This in turn causes output node G of NOR gate 15 to be low and the output of inverter 18 (node H) to be high.

Gate 19 is in a conducting condition when its input signal, node H, is high thus enabling the voltage signal from node C to be transmitted and appear as node I. Since the output from high threshold inverter 11, (node C), is high, the voltage signal at node I is high and the inverter output signal of inverter 21, node J, is low. It is to be noted that whenever gate 19 is turned off, gate 20 will pull node I to a low level.

A second state (II in FIG. 2) is entered when the input signal, node A, begins to rise. As it reaches the low threshold level of inverter 10, the output thereof, node D, is caused to go low and the circuitry of FIG. 1 enters in a transition state between two stable, long-term states of the input signal being fully low or fully high. Since the output of low inverter 10, node D, is now low, gate 17 is turned off isolating the junction with gate 16, node F, since gate 16 is also in an off condition. This dynamic state of node F preserves the previous value, a low, while the circuit is in the transition from a low input signal to a high input signal. The length of time a stored charge can remain on the node is limited because of leakage. However, node F need only be of sufficient duration to hold this charge during the rise time of the input signal and later on, during the fall time of the input signal at node A. This time is far less than the leakage time.

During the second state (II), both nodes D and F are low and these represent the input signals to NOR gate 15. As a result, the output of NOR gate 15, node G, is high turning on transistor 20 and, by way of inverter 18, turning off transistor 19. Gate 20 pulls node I low from its previous high which in turn causes output inverter 21 to output a high signal, node J. This transition from a low value to a high value for node J is the sensed output signal as a result of the input signal rising above the low threshold value. The circuit will remain in state II until the threshold of the high threshold inverter 10 is reached.

When the threshold of high threshold inverter 10 of FIG. 1 is obtained, the circuit of that figure enters the third state, III. As the input signal, node A, continues to rise, so too will node B, the input to high threshold inverter 11, continue to rise. When the high threshold value of high threshold inverter 11 is reached, the output therefrom, node C, will go low. This is the input to gate 19 which, however, is in an off condition and so there is no effect on either nodes I or J. Node I remains isolated from node C and continues to be held in low value by gate 20. The output from high threshold inverter 11, node C, goes to inverter 14 which will now have a high output, node E, thereby turning on gate 16 and pulling node F high. Node F was previously isolated, but is now being driven by gate 16. A high value for node F causes NOR gate 15 to output a low value for node G thereby turning off gate 20 and turning on gate 19. This enables node I to follow node C and the output signal, node J, does not change. The circuit of FIG. 1 is now in a stable state. It can remain this way indefinitely because there are no nodes holding a charge. The circuit is now prepared for the high to low transition of the input signal to the circuit.

This circuit now enters its fourth state (IV) as indicated in FIG. 2. The input signal of state III is above the threshold of both the high and low threshold inverters 11 and 10 of FIG. 1. As the input signal, node A, falls, it first goes below the threshold of high threshold inverter 11 and node C returns to its high state. Since gate 19 is in an on condition from the previous state, node I follows node C and goes high which causes the output signal, node J, to go low. This transition from a high to low value of node J is the sensed output signal as the result of the input signal crossing the high threshold value. Node C drives the output of inverter 14 low, thereby turning off gate 16. Now, both gates 16 and 17 are in an off condition, thereby isolating the high voltage value on node F. This in turn keeps the output signal of NOR gate 15, node G, low and gate 19 turned on. As in state II, the circuit will remain in this condition until the input signal, node A, falls below the low threshold value of the circuit. When that occurs, the output signal from low threshold inverter 10, node D, goes high, thereby discharging node F through gate 17. The output signal, node G, of NOR gate 15 remains low since node D is now high, thereby taking over this function from node F. Nodes C, H, and I remain the same as does node J. The circuit is now in its initial state, ready for the next low to high transition of the input signal.

One comment should be made about the input signals which change from a stable low state or a stable high state only to return to those states without entering the other stable state. The circuitry of the present invention is designed to return to its previous stable state should any noise or uncertainty about the input signal cause a temporary excursion into one of the transition modes (states II and IV).

A particular comment will now be made upon the respective inverter circuits employed in the present invention. The circuits of inverters 11, 14, and 18 of FIG. 1 are illustrated in FIG. 3 and are common MOS transistor inverters formed of a driving transistor 23 which is an enhancement-type MOS transistor and a load transistor 22 which is a depletion-type MOS transistor. Low threshold inverter 10 of FIG. 2 is a similar type of inverter circuit except that driving transistor 23 is a control enhancement transistor. That is to say, it is formed by an implantation technique so as to have a lower threshold value and, therefore, a faster turn-on characterstic. A suitable implantation technique is described in a paper entitled "Device Design Considerations for Ion Impanted n-Channel MOSFETs" by Rideout et al in the *IBM Journal of Research and Development*, Vol. 19, 1975, page 50. FIG. 4 is an alternative embodiment of high threshold inverter 11 which does not require a voltage divider in many applications and yet achieves the appropriate effective high threshold as required.

EPILOGUE

Circuitry has been disclosed above which includes a low threshold detector and a high threshold detector in the form of inverters the respective output signals of which are combined in such a manner that the output signal of the circuitry is a function of the input signal rising above a low threshold and remaining in an on condition until the input signal has risen above a high threshold and then declined below it. In addition, the circuitry includes a circuit memory element in which is stored the last stable state of the circuitry so that if noise or transients should occur on the input line, the circuitry can return to that stable state.

This circuit enables the rapid detection of a memory readout even though the signals on the memory sense lines have relatively slow rise and fall times due to the capacitances on those lines which in turn are due to the large number of memory cells involved. Furthermore, the disclosed invention can be employed in any system in which switching speed is of importance.

While but one embodiment, of the present invention has been disclosed, it will be apparent to those skilled in the art that variations and modifications may be made therein without departing from the spirit and scope of the invention as claimed.

What is claimed is:

1. A threshold detector circuit coupled to a sense line for sensing a signal on said line, said detector circuit comprising:
    a low threshold detector means having an input terminal coupled to said sense line and having an output terminal;
    a high threshold detector means having an input terminal coupled to said sense line and having an output terminal, said high threshold detector means being formed of an inverter circuit with a high threshold driving transistor and said low threshold detector means being formed of an inverter circuit with a driving transistor which is formed by an implantation technique so as to have a low threshold; and,
    an output means having input terminals coupled to said respective output terminals of said low threshold detector means and high threshold detector means and having an output terminal without any feedback circuitry coupled thereto for providing a first level output signal on an output terminal of said detector circuit when said signal on said sense line rises above said low threshold, said first level output signal remaining until said signal on said sense line rises above and then declines below said high threshold whereupon said output means provides a second level output signal on said detector circuit output terminal.

2. A threshold detector circuit according to claim 1 wherein said output means includes a logic NOR gate having a pair of input terminals coupled to said respective output terminals of said high and said low threshold detector means and a non-inverting output terminal coupled to the control element of a first transistor switching means and an inverting output terminal coupled to the control element of a second transistor switching means, said first transistor switching means being coupled between a reference potential and said output terminal of said detector circuit and said second transistor switching means being coupled between said output terminal of said high threshold detector means and said output terminal of said detector circuit.

3. A threshold detector circuit according to claim 2 wherein said first and second transistor switching means are MOSFETs.

4. A threshold detector circuitry according to claim 1 wherein:
    said inverter circuits are formed of MOS transistors including a driving transistor which is of an enhancement-type and a load transistor which is of depletion-type.

5. A memory system including a threshold detector circuit coupled to a sense line of the memory for sensing a signal on said line, said detector circuit comprising:
    a low threshold detector means having an input terminal coupled to said sense line and having an output terminal;
    a high threshold detector means having an input terminal coupled to said sense line and having an output terminal, said high threshold detector means being formed of an inverter circuit with a high threshold driving transistor and said low threshold detector means being formed of an inverter circuit with a driving transistor which is formed by an implantation technique so as to have a low threshold; and,
    an output means having input terminals coupled to said respective output terminals of said low threshold detector means and high threshold detector means and having an output terminal without any feedback circuitry coupled thereto for providing a first level output signal on an output terminal of said detector circuit when said signal on said sense line rises above said low threshold, said first level output signal remaining until said signal on said sense line rises above and then declines below said high threshold whereupon said output means provides a second level output signal on said detector circuit output terminal.

6. A threshold detector circuitry according to claim 5 wherein:
said inverter circuits are formed on MOS transistors including a driving transistor which is of an enhancement-type and a load transistor which is of depletion-type.

7. A threshold detector circuit according to claim 5 wherein said output means includes a logic NOR gate having a pair of input terminals coupled to said respective output terminals of said high and said low threshold detector means and a non-inverting output terminal coupled to the control element of a first transistor switching means and an inverting output terminal coupled to the control element of a second transistor switching means, said first transistor switching means being coupled between a reference potential and said output terminal of said detector circuit and said second transistor switching means being coupled between said output terminal of said high threshold detector means and said output terminal of said detector circuit.

8. A threshold detector circuit according to claim 7 wherein said first and second transistor switching means are MOSFETs.

* * * * *